(12) United States Patent
Pangal et al.

(10) Patent No.: US 9,257,175 B2
(45) Date of Patent: Feb. 9, 2016

(54) REFRESH OF DATA STORED IN A CROSS-POINT NON-VOLATILE MEMORY

(71) Applicant: INTEL CORPORATION, Santa Clara, CA (US)

(72) Inventors: Kiran Pangal, Fremont, CA (US); Raj K. Ramanujan, Federal Way, WA (US); Robert W. Faber, Hillsboro, OR (US); Rajesh Sundaram, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 203 days.

(21) Appl. No.: 14/038,165

(22) Filed: Sep. 26, 2013

(65) Prior Publication Data

US 2015/0089120 A1    Mar. 26, 2015

(51) Int. Cl.
| | | |
|---|---|---|
| *G06F 13/12* | (2006.01) | |
| *G11C 11/00* | (2006.01) | |
| *G11C 13/00* | (2006.01) | |

(52) U.S. Cl.
CPC ........ *G11C 13/0033* (2013.01); *G11C 13/0004* (2013.01)

(58) Field of Classification Search
CPC ...................................................... G11C 11/00
USPC ............................................................ 710/62
See application file for complete search history.

(56) References Cited

U.S. PATENT DOCUMENTS

| 7,068,534 | B2 * | 6/2006 | Bedeschi et al. | 365/163 |
|---|---|---|---|---|
| 7,622,731 | B2 * | 11/2009 | Sutardja et al. | 257/5 |
| 7,894,254 | B2 * | 2/2011 | Lung | 365/163 |
| 8,750,033 | B2 * | 6/2014 | Worledge | 365/158 |
| 2009/0067229 | A1 | 3/2009 | Kang et al. | |
| 2009/0086527 | A1 | 4/2009 | Lee et al. | |
| 2011/0149628 | A1 * | 6/2011 | Langtry et al. | 365/51 |
| 2012/0147660 | A1 | 6/2012 | Chevallier et al. | |
| 2013/0003451 | A1 | 1/2013 | Bedeschi et al. | |
| 2013/0148407 | A1 | 6/2013 | Tsuji et al. | |
| 2014/0244946 | A1 * | 8/2014 | Khoueir et al. | 711/154 |
| 2014/0281203 | A1 | 9/2014 | Damle et al. | |

OTHER PUBLICATIONS

International Search Report and Written Opinion issued in International Application No. PCT/US2014/052746, mailed Dec. 3, 2014, 11 pages.

* cited by examiner

*Primary Examiner* — Titus Wong
(74) *Attorney, Agent, or Firm* — Schwabe, Williamson & Wyatt, P.C.

(57) ABSTRACT

Embodiments including systems, methods, and apparatuses associated with refreshing memory cells are disclosed herein. In embodiments, a memory controller may be configured to perform a read operation on one or more memory cells in a cross-point non-volatile memory such as a phase change memory (PCM). The one or more memory cells may have voltage values respectively set to a first threshold voltage or a second threshold voltage. Based on the read, the memory controller may identify the memory cells in the cross-point non-volatile memory that are set to the second threshold voltage, and refresh the voltage values of those cells without altering the voltage values of the memory cells in the cross-point non-volatile memory that are set to the first threshold voltage. Other embodiments may be described or claimed.

17 Claims, 6 Drawing Sheets

REFRESH OF DATA STORED IN A CROSS-POINT NON-VOLATILE MEMORY

FIELD

Embodiments of the present invention relate generally to the technical field of memory. Specific embodiments include methods of refreshing a cross-point memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Cross point non-volatile memory, including phase-change memory (PCM), may consist of a two- or three-dimensional grid of memory cells. Systems using PCM may construct a memory address as a combination of multiple memory cells from one or more memory arrays. Memory cell state may be represented by a voltage threshold, which may be notated as $V_T$. In some PCM, the voltage value of each cell may be settable to one of two voltage thresholds, which may represent a logical "0" or "1," respectively. The voltage value of a memory cell may be positioned by a write operation and read by a read operation. In some cases, the physical mechanisms behind the read and write operations on a given memory cell or memory address may cause one or more other memory cells or memory addresses to lose the data stored in them or otherwise get disturbed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
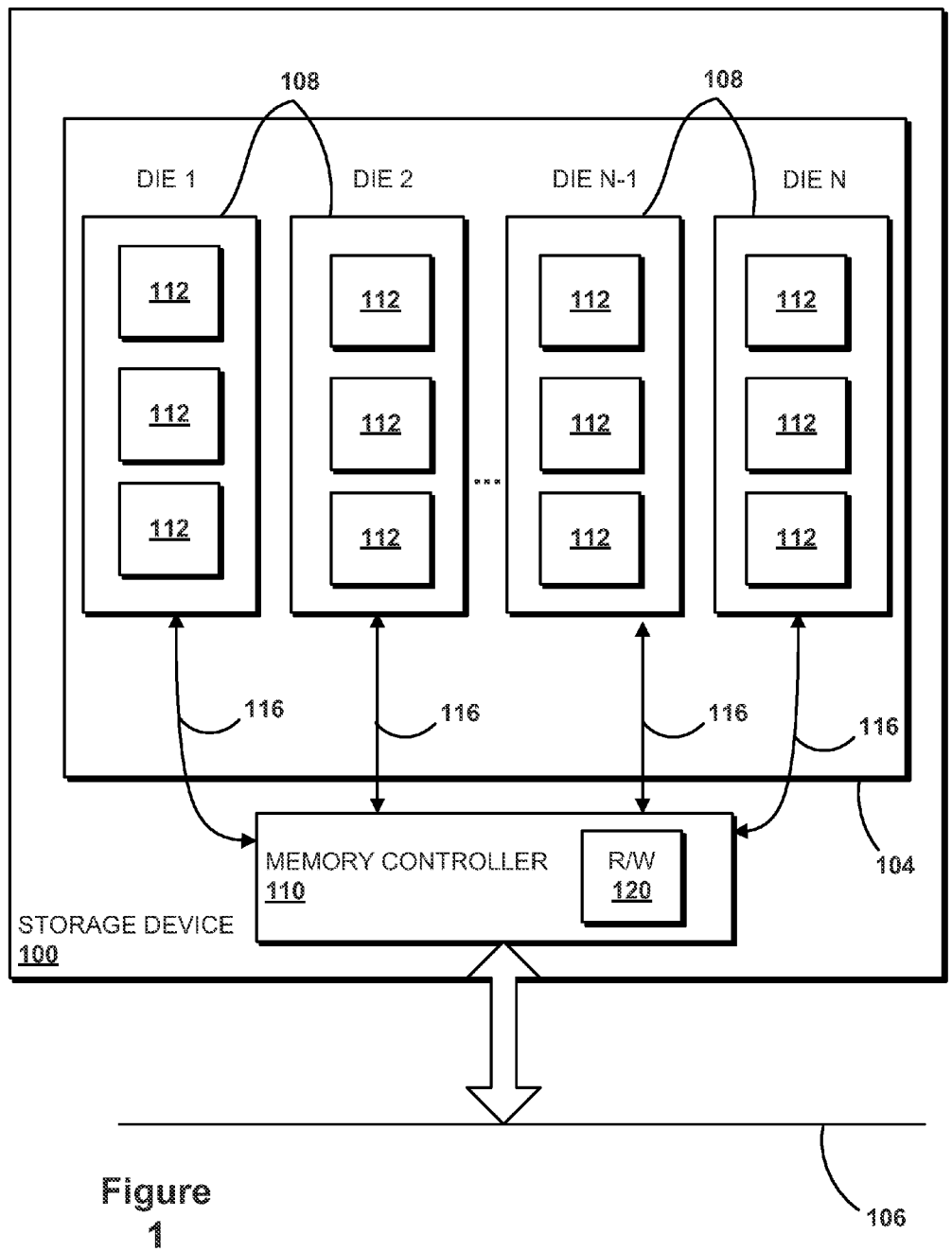
FIG. 1 illustrates an example storage drive incorporated with the teachings of the present disclosure, in accordance with various embodiments.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Apparatuses, methods, and storage media associated with refreshing memory cells are discussed herein. In embodiments, a cross-point non-volatile memory, for example PCM, may include a plurality of memory cells having respective voltage values that are settable to a first threshold voltage or a second threshold voltage. However, over time the voltage values of one or more of the memory cells that are set to the first or second threshold voltage may start to drift. A memory controller may be configured to perform a read operation on the memory cells. The read operation may reset the voltage values of the memory cells that were set to the first threshold voltage. That is, the read operation may cause the voltage values of the memory cells to return to the first threshold voltage. The read operation may also allow the memory controller to identify the memory cells that were set to the second voltage value. The memory controller may then be configured to perform a write operation to reset the voltage values of the memory cells back to the second threshold voltage.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smartphone (which may include one or more processors), a tablet, laptop computer, a set-top box, a gaming console, and so forth.

With reference to FIG. 1, in various embodiments, a storage device 100, may include a cross-point non-volatile memory 104 such as PCM. Information may be written to and/or read from the cross-point non-volatile memory 104 by a memory controller 110. The memory controller 110 may be coupled with the cross-point non-volatile memory 104 by way of one or more communication lines 116, e.g., a memory bus. The read or write operations may be respectively performed by read logic or write logic which may be separate from one another, or combined such as read/write module 120. For the purposes of this discussion, the read/write module 120 will be discussed, and may be assumed to include both the read logic and the write logic. However in other embodiments a read module may contain the read logic and perform the read operations discussed below, and a write module may include the write logic and perform the write operations discussed below, and the read module and the write module may be separate from one another.

As shown, the read/write module 120 may be an element of the memory controller 110, while in some embodiments the read/write module 120 (or a separate read module and/or write module) may be separate from, but communicatively coupled to, the memory controller 110. In some embodiments (not shown) the read/write module 120 may be an element of, or otherwise coupled with, the cross-point non-volatile memory 104. In some embodiments (not shown) the read/write module 120 may be distributed across both the memory controller 110 and the cross-point non-volatile memory 104. In some embodiments, the read/write module 120 may be implemented as hardware, firmware, software, or some combination thereof. In embodiments, the read/write module 120 may be configured to perform a read operation to read voltage values of one or more memory cells 112 of the cross-point non-volatile memory 104, as described below. Additionally, the read/write module 120 may be configured to perform a write operation to set, or reset, the voltage values of the one or more memory cells 112 of the cross-point non-volatile memory 104, as further described below. In embodiments, the voltage value of a memory cell 112 of the cross-point non-volatile memory 104 may be considered the value of the voltage measured across the memory cell 112 during a read operation by the read/write module 120, as described in further detail below.

In some embodiments, the memory controller 110 and/or storage device 100 may be coupled with other components of a computing system via one or more external communication lines 106 such as a peripheral component interconnect (PCI) or PCI express bus. Although not depicted, various other components may be coupled with storage device 100 via one or more communication lines 106, including but not limited to one or more central processing units (CPUs), volatile memory (e.g., DRAM), one or more input/output (I/O) devices, alternative processing units (e.g., graphics processors), and so forth. In various embodiments, storage device 100 may be a solid state drive (SSD) or hybrid hard drive (HHD).

In many cases, including the example of FIG. 1, the cross-point non-volatile memory 104 may include a plurality of die 108. For example, in FIG. 1, the cross-point non-volatile memory 104 includes N die 108. N may be any positive integer. In other embodiments, the cross-point non-volatile memory 104 may only include a single die 108. As shown in FIG. 1, each die 108 may have one or more memory cells 112. It will be understood that although three memory cells 112 are shown per die 108, each die may have more or less memory cells 112. Additionally, each die 108 does not necessarily have to have the same amount of memory cells 112 as another die 108. Finally, the data may be arranged in different groupings as described herein, for example the memory cells 112 may be arranged as blocks or pages of memory.

Figure 2:
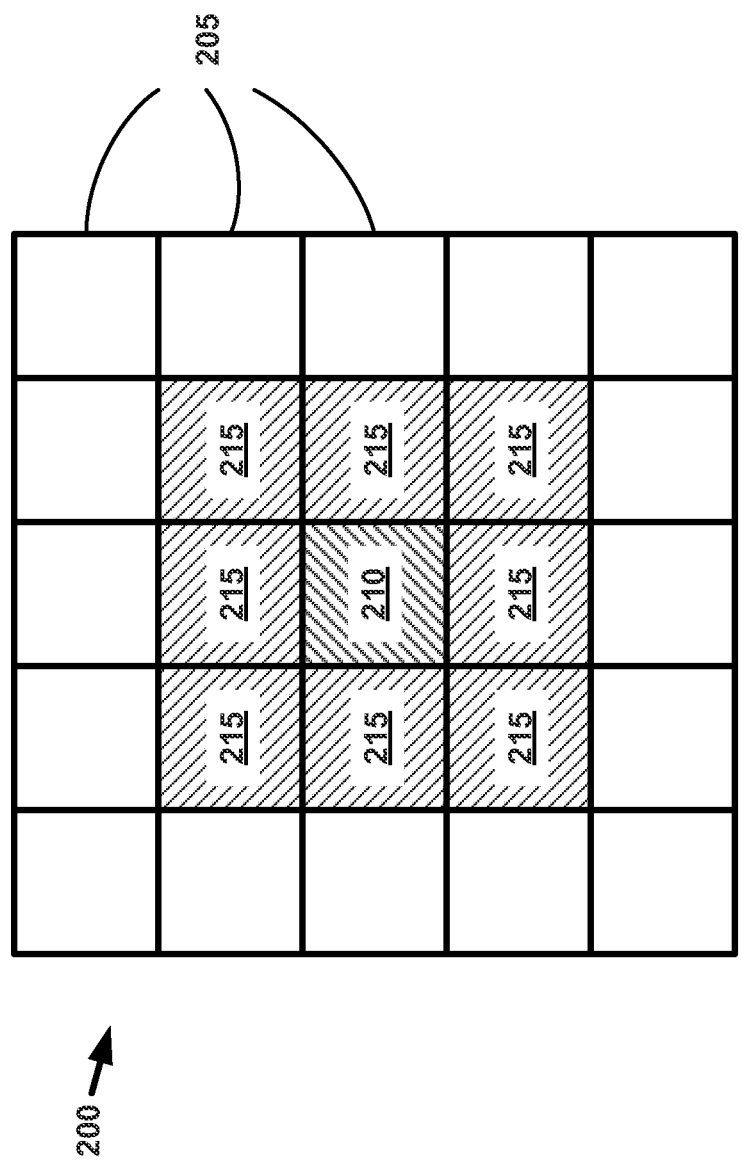
FIG. 2 illustrates example of memory cells, in accordance with various embodiments.

As described above, cross-point non-volatile memory such as cross-point non-volatile memory 104, or each die of a cross-point non-volatile memory such as die 108 of cross-point non-volatile memory 104, may include a plurality of memory cells arranged into a two- or three-dimensional grid. FIG. 2 depicts a grid 200 of memory cells 205 of a cross-point non-volatile memory such as cross-point non-volatile memory 104. Specifically, the grid 200 may be a grid of memory cells 205 on a die such as die 108 of cross-point non-volatile memory 104. Although the grid 200 is depicted herein as a two-dimensional grid, in embodiments the grid 200 may be a three-dimensional grid. One or more of the memory cells 205 may be set to a first threshold voltage or a second threshold voltage, which may respectively indicate a logical value such as "0" or "1." In embodiments, each memory cell 205 may therefore be considered to hold a bit of information.

Specifically, cross-point non-volatile memory such as cross-point non-volatile memory 104, which may be a PCM, may be constructed of chalcogenide glass. For example, the cross-point non-volatile memory may include a material such as $Ge_2Sb_2Te_5$, referred to as GST, or InSbTe, referred to as IST. Other materials may be used in cross-point non-volatile memory, however for ease of explanation only chalcogenide glass will be discussed below as an example. Specifically, each memory cell such as memory cells 205 may be a separate discrete element of chalcogenide glass. If the chalcogenide glass of a memory cell 205 is quickly heated and then quenched, then the chalcogenide glass may be in a physical state known as an "amorphous" state. By contrast, if the chalcogenide glass of a memory cell 205 is held at a certain temperature for a given amount of time, then the chalcogenide glass may crystallize and be in a physical state known as a "crystalline" state. In embodiments, the heating process may be directed or performed by a writer such as read/write module 120, and be performed by running a current through a given memory cell 205 for a given amount of time. The natural electrical resistance of the chalcogenide glass may create heat in the memory cell 205, and result in the described phase change of the memory cell 205.

In embodiments, a memory cell 205 in an amorphous state may have a different electrical resistance than a memory cell 205 in a crystalline state. For example, a memory cell 205 in an amorphous state may have a relatively low electrical resistance, and exist in a "set" state. By contrast, a memory cell 205 in a crystalline state may have a relatively high electrical resistance, and exist in a "reset" state. In embodiments, the "set" state and the "reset" state may respectively correspond to a logical "0" and a logical "1," or vice versa. For ease of description below, the terms "low" state and "high" state will be used to respectively describe the "set" state and "reset" state of a memory cell 205.

In order to read the logical value of a memory cell 205, a small current may be run through the memory cell 205, and the voltage value across the memory cell 205 may be measured. Because voltage is equal to current times resistance, and a memory cell 205 in the "low" state may have a different resistance than a memory cell 205 in the "high" state, the measured voltage value of the memory cell 205 may be different dependent on the state the memory cell 205 is in. For example, a "low" state of a memory cell 205 may be indicated by a measurement of a relatively low voltage value across the memory cell 205, while a "high" state of a memory cell 205 may be indicated by a measurement of a relatively high voltage value across the memory cell 205.

Because a specific state of the chalcogenide glass may result in a specific resistance, which may result in measurement of a specific voltage value, it may be desirable to set the physical state of each memory cell 205 so that the memory cell 205 produces a measurement of a specific voltage value during a read operation, known as a voltage threshold $V_T$, for the "low" or "high" states. In embodiments, and as described in further detail below, the read operation may be the process of comparing the measured voltage value of a memory cell against a reference voltage value to determine whether the memory cell is in the "low" or "high" state. By contrast, the operation to alter the physical properties of a memory cell 205 so that it produces a measurement of a given voltage value during a read operation may be known as a write operation. Specifically, the read/write module 120 may perform a write operation to change the physical properties of the chalcogenide glass of one or more memory cells 205 so that each memory cell 205 that is set to the "low" state will have the same electrical resistance, and therefore the read/write module 120 may read the same relatively low voltage value across each memory cell 205 in the "low" state. Similarly, the read/write module 120 may perform a write operation to change the physical properties of the chalcogenide glass of one or more memory cells 205 so that each memory cell 205 that is set to the "high" state will have the same electrical resistance, and therefore the read/write module 120 may read the same relatively high voltage value across each memory cell 205 in the "high" state.

In embodiments, a target memory cell 210 may be surrounded by a plurality of adjacent memory cells 215. When a writer, such as read/write module 120 of memory controller 110 writes a value to the target memory cell 210, then the voltage values of the adjacent memory cells 215 may be affected. This effect may be called a "memory disturb." As noted above, writing a value to a target memory cell 210 may include heating and/or cooling the target memory cell 210. Additionally, reading a value from a target memory cell 210 may include sending a known current through the target memory cell 210 and measuring the voltage across the target memory cell 210. In each of these processes, the target memory cell 210 may generate heat in one or more of the adjacent memory cells 215. Additionally or alternatively, heat may be generated in the target memory cell 210. This generated heat may result in changing the state of one or more of the target memory cell 210, the adjacent memory cells 215, or some other memory cell 205 in the grid 200 of memory cells 205. Memory disturb may be caused by additional or alternative mechanisms such as mechanical failure of the memory cell 205, or some other reason.

When the state of a given memory cell 205 such as the target memory cell 210, an adjacent memory cell 215, or some other memory cell 205 changes, then the measured voltage value of that memory cell may change. Specifically, the voltage value of a memory cell 205 that is set to the "low" threshold voltage may slightly increase. For example, if the "low" threshold voltage of a given cross-point non-volatile memory 104 is 1.0 V, then a memory cell that is meant to be set to the "low" state may be initially set by the read/write module 120 via a write operation to have a voltage value of 1.0V during a read operation. However, due to memory disturb, the voltage value of that memory cell 205 may increase over time. Alternatively, if the "high" threshold voltage of a given cross-point non-volatile memory 104 is 2.0V, then a memory cell that is meant to be set to the "high" state may be initially set by the read/write module 120 via a write operation to have a voltage value of 2.0V during a read operation. However, memory cells 205 that are set to the "high" state may experience either increasing or decreasing drift. That is, over time the voltage of the memory cell 205 that is set to the "high" state may have a voltage value that is higher or lower than 2.0V.

This drift may cause data errors because a read/write module 120 performing a read operation of a given memory cell 205 may assume that the memory cell 205 is in a "high" state when it is meant to be in a "low" state, or vice versa. Because of these errors, it may therefore be desirable to periodically refresh the values of one or more memory cells 205 in the cross-point non-volatile memory 104. That is, in some cases it may be desirable for the read/write module 120 to refresh the voltage value of each memory cell 205 by performing a write operation to set each memory cell 205 to the desired voltage threshold. In other words, for memory cells 205 that are intended to be in the "high" state, the read/write module 120 may alter the physical state of the memory cells so that a measured voltage value of those memory cells 205 during a read operation are equal to the "high" voltage threshold. By contrast, for memory cells 205 that are intended to be in the "low" state, the read/write module 120 may alter the physical state of the memory cells 205 so that the measured voltage values of those memory cells 205 during a read operation are equal to the "low" voltage threshold. However, in many cases fully refreshing each cell in a given cross-point non-volatile memory such as cross-point non-volatile memory 104 may be undesirable because the full refresh operation may result in system latency and/or system energy/power consumption.

Figure 3:
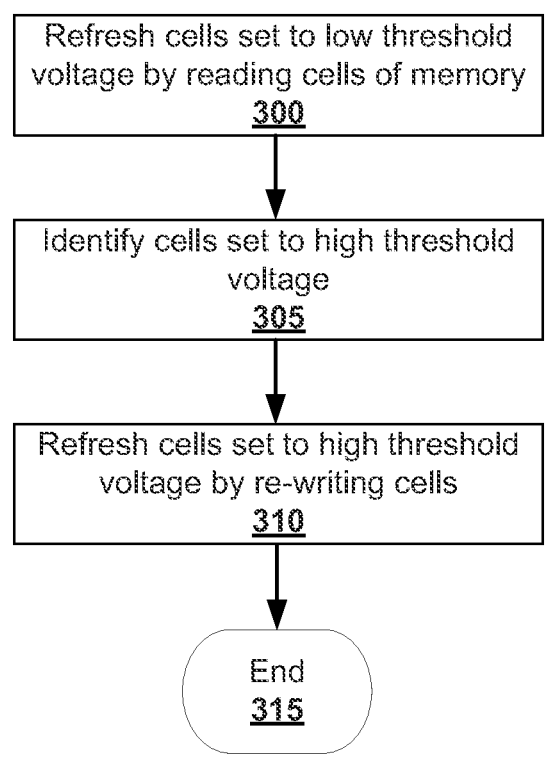
FIG. 3 illustrates an example process for refreshing memory cells, in accordance with various embodiments.

FIG. 3 depicts an example of an alternative process for performing a refresh of a plurality of memory cells, e.g., memory cells 205 of a cross-point non-volatile memory such as cross-point non-volatile memory 104. Initially, a read/write module such as read/write module 120 may first perform a read operation to read the voltage value of each memory cell in a given cross-point non-volatile memory at 300. Because the read operation involves measuring the voltage value across each memory cell when a known current is transmitted through the cell, the read operation itself may result in changing the state of the memory cell.

Specifically, a read operation may comprise the read/write module comparing the measured voltage of a memory cell of the cross-point non-volatile memory with a reference voltage. The reference voltage may be, for example, a voltage that is higher than the "low" voltage threshold, but less than the "high" voltage threshold. As an example, if the "low" voltage threshold is 1.0V, and the "high" voltage threshold is 2.0V, then the reference voltage may be 1.5V. However, in other embodiments one or more of the "low" voltage threshold, the "high" voltage threshold and/or the reference voltage may be a different voltage. In some embodiments the read operation may result in refreshing the voltage value of one or more of the memory cells that are in the "low" state such that the voltage value of the one or more memory cells in the "low" state is equal to the "low" voltage threshold.

Next, the read/write module may identify, based at least in part on the read operation performed at 300, the memory cells in the cross-point non-volatile memory that are in the "high" state. Specifically, the read/write module and/or a memory controller such as memory controller 110 may identify the memory cells in the cross-point non-volatile memory that had a voltage value above the reference voltage, as described above.

Finally, the read/write module may refresh the voltage values of the memory cells in the cross-point non-volatile memory that are set to the "high" voltage threshold at 310. That is, the read/write module may perform a write operation to one or more of the memory cells that changes the physical state of the one or more memory cells such that the voltage value of the one or more of the memory cells is reset to the "high" voltage threshold. The process of refreshing the one or more cells of memory may then end at 315.

Figure 4:
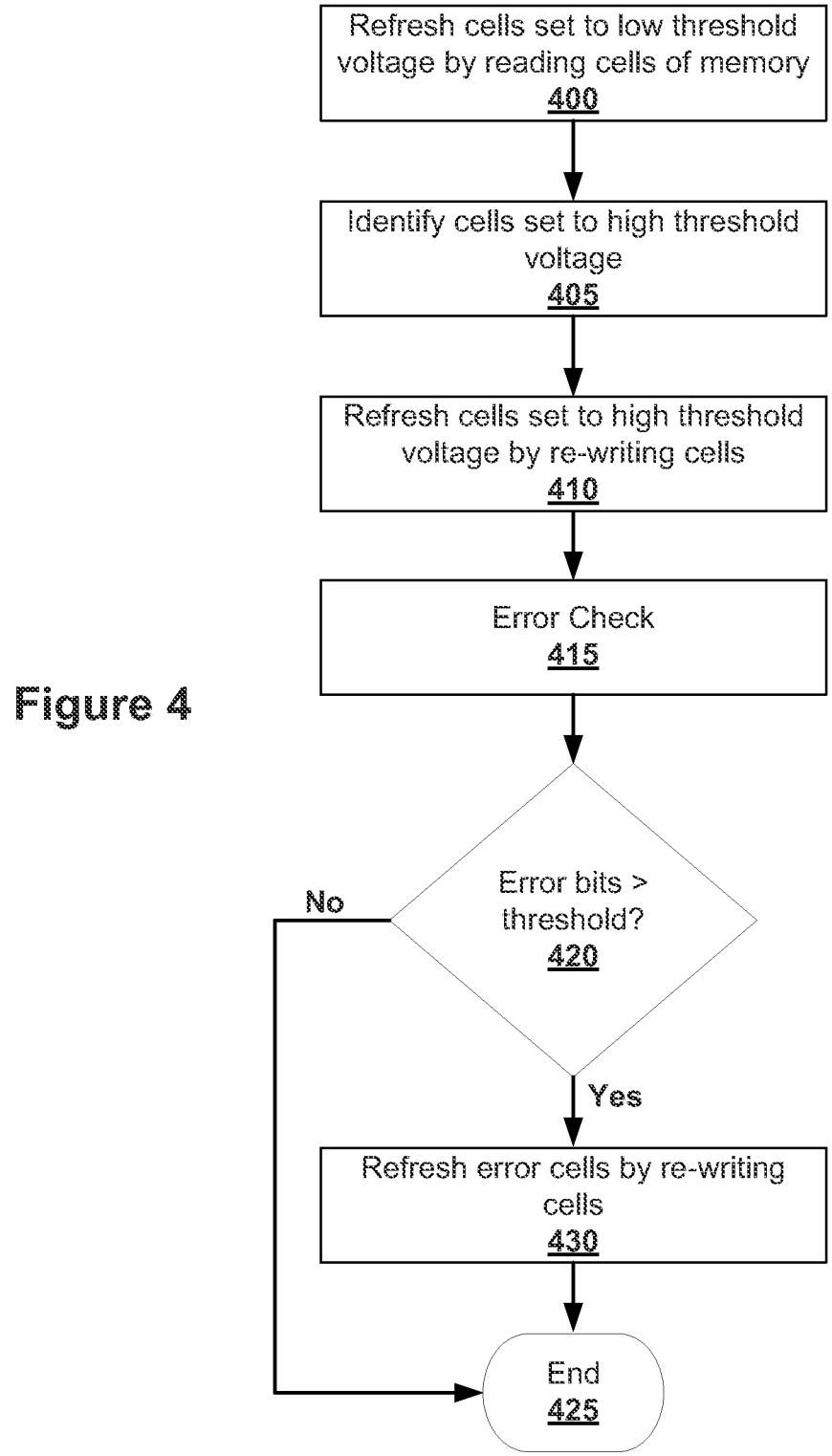
FIG. 4 illustrates an alternative process for refreshing memory cells, in accordance with various embodiments.

In some embodiments, a cross-point non-volatile memory such as cross-point non-volatile memory 104 may have one or more memory cells that produce errors during a read operation of the memory cell in the cross-point non-volatile memory. FIG. 4 depicts an alternative process for potentially reducing the number of errors that may result from a read operation of the one or more memory cells of the cross-point non-volatile memory.

Initially, a read/write module such as read/write module 120 may first read the voltage value of each memory cell in a given cross-point non-volatile memory at 400. As described above with respect to element 300 of FIG. 3, the read operation itself may result in changing the physical state, and therefore the voltage value, of the memory cell. Additionally, one or more memory cells in the cross-point non-volatile memory may be identified that are in the "high" state at 405 by the read/write module during the read operation, as described above with respect to element 305 of FIG. 3. Finally, the read/write module may refresh the voltage values of the one or more cells that are set to the "high" state at 410 by performing a write operation to the one or more memory cells that reset the voltage values of the one or more memory cells to the "high" threshold, as described above with reference to element 310 of FIG. 3.

The memory controller, for example memory controller 110 or the read/write module 120 of the memory controller, may then perform a check for errors in the data stored in the cross-point non-volatile memory at 415. In some embodiments, the check for errors may include an error correcting code (ECC) check of some or all of the data stored in the cross-point non-volatile memory, though in other embodiments (not shown) a different type of error check may be performed. Specifically, if an ECC check is performed, the memory controller may compare one or more logical values of the memory cells of the cross-point non-volatile memory, or one or more codewords based on the logical values of the memory cells of the cross-point non-volatile memory, with one or more known values or codewords. In some embodiments the codewords based on the logical values of the memory cells and/or the known codewords may be stored in the cross-point non-volatile memory, while in other embodiments one or both of the codewords or the known codewords may be stored in a different memory of the computer system such as a read only memory (ROM), random access memory (RAM), or some other memory of the computer system. Based on the comparison, the memory controller may be configured to identify one or more memory cells in the cross-point non-volatile memory that produce an error during a read operation of the memory cell. The error may be signaling that the memory cell is in the "high" state when the memory cell is in the "low" state, or vice versa. Alternatively, the error may be simply that the state of the memory cell is not determinable.

The memory controller may then compare the total number of memory cells that produce an error to an error threshold at 420. In some cases, the error threshold may be 10%, though in other embodiments the error threshold may be some other number. That is, if 10% of the memory cells produce errors during a read operation, then the memory controller may determine that the number of memory cells that produce an error exceed the threshold. If the total number of memory cells that produce an error do not exceed the threshold, then the process may end at 425.

However, if the total number of memory cells that produce an error do exceed the threshold, then the memory controller may refresh the one or more memory cells that produce an error by performing a write operation on the cells at 430. Specifically, for memory cells that are identified as being in a "low" state, the read/write module of the memory controller may perform a write operation to reset the voltage value of the memory to the low voltage threshold. Similarly, for memory cells that are identified as being in the "high" state, the read/ write module of the memory controller may perform a write operation to reset the voltage value of the memory cells to the high voltage threshold. In some embodiments these write operations may be reversed, for example if the cells that should be in a "low" state are read as being in the "high" state, or vice-versa, then the read/write module may perform a write operation on cells that are identified as being in a "low" state to set the voltage values of those cells to the high voltage threshold, or vice-versa for cells that are identified as being in the "high" state. In some embodiments, the voltage value of the write operation may be selected based at least in part on the error check performed at 420, and the write operation performed at 430 may be based on writing a voltage value to a memory cell that will cause the error check to not produce an error during a read operation. For example, the memory cells that produce an error may be identified at 405, and the voltage values of those memory cells may be "flipped" during the refresh operation at 430 so that memory cells that produced an error during the read operation because they were read as being in the "low" state may be refreshed to the "high" state, or vice-versa.

Figure 5:
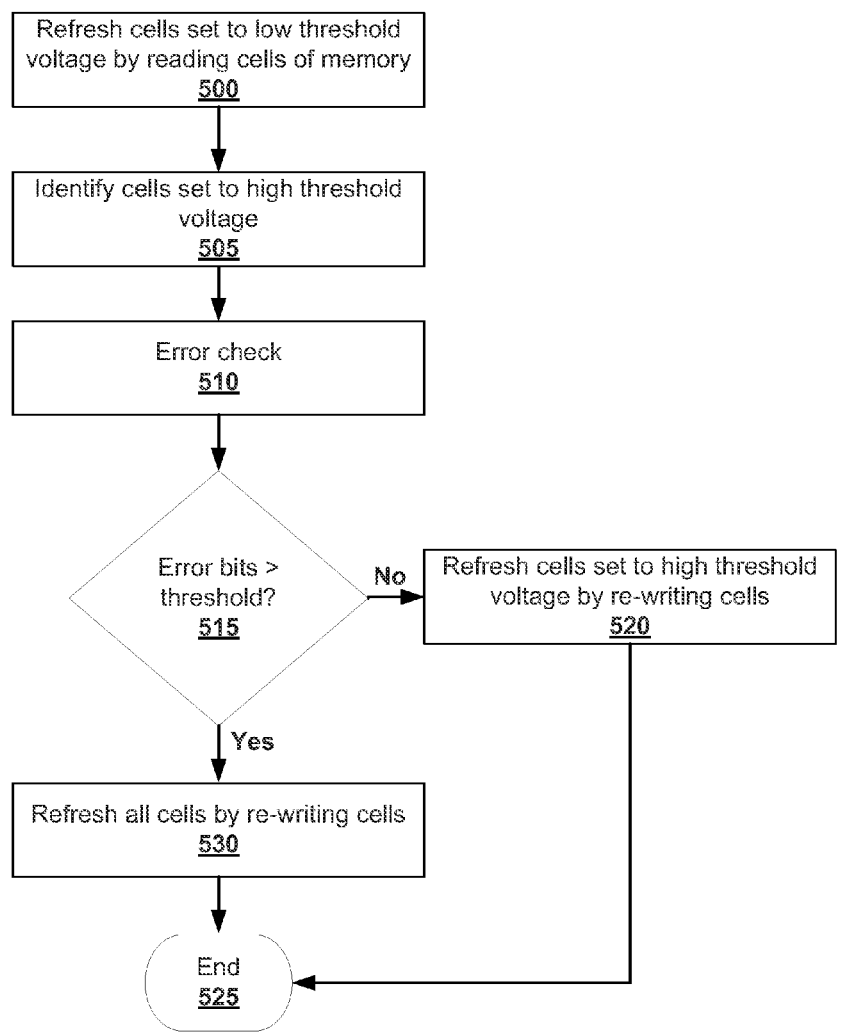
FIG. 5 illustrates an alternative process for refreshing memory cells, in accordance with various embodiments.

FIG. 5 depicts an alternative process for reducing the number of errors that result from a read operation of one or more memory cells of a memory, e.g., a cross-point non-volatile memory. Initially, a read/write module such as read/write module 120 may first read the voltage value of each memory cell in a given memory, e.g., an example cross-point non-volatile memory, at 500. As described above with respect to element 300 of FIG. 3 and element 400 of FIG. 4, the read operation itself may result in changing the state of the memory cell. Additionally, one or more memory cells in the example cross-point non-volatile memory may be identified that are in the "high" state at 505 by the read/write module during the read operation, as described above with respect to element 305 of FIG. 3 and element 405 of FIG. 4.

The memory controller, for example memory controller 110 or the read/write module 120 of the memory controller, may then perform a check for errors in the data stored in the cross-point non-volatile memory at 510, which may be similar to the error check described above at 415. In some embodiments, the check for errors may be an ECC check of some or all of the data stored in the example cross-point non-volatile memory. In other embodiments (not shown), a different type of error check may be performed. Based on the comparison, the memory controller may be configured to identify one or more memory cells in the example cross-point non-volatile memory that produce an error upon a read operation of the memory cell. The memory controller may compare the total number of memory cells that produce an error to an error threshold at 515, which may be similar to the comparison described with respect to 420. In some cases, the error threshold may be 10%, though in other embodiments the error threshold may be some other number.

If the total number of memory cells that produce an error do not exceed the threshold, then the process may proceed to refresh the memory cells identified at 505 that are set to the "high" threshold voltage by re-writing the voltage values of those cells at 520. The refresh and re-write process may be similar to, for example, the refresh and re-write process described at 410. The process may then end at 525.

However, if the total number of memory cells that produce an error exceed the threshold, then the memory controller may refresh and re-write all of the memory cells in the example cross-point non-volatile memory at 530. That is, for each cell in the example cross-point non-volatile memory that is identified as being in a "low" state, the read/write module of the memory controller may perform a write operation to reset the voltage value of the memory cell to the low voltage threshold. Similarly, for each memory cell in the example cross-point non-volatile memory that is identified as being in the "high" state, the read/write module of the memory controller may perform a write operation to set the voltage value of the memory cells to the high voltage threshold. In some embodiments these write operations may be reversed, for example if the cells that should be in a "low" state are read as being in the "high" state, or vice-versa. Then, the read/write module may perform a write operation on cells that are identified as being in a "low" state to reset the voltage values of those cells to the high voltage threshold, or vice-versa for cells that are identified as being in the "high" state. In some embodiments, the voltage value of the write operation may be selected based at least in part on the error check performed at 510, and the write operation performed at 530 may be based on writing a voltage value to a memory cell that will cause the error check to not produce an error when the voltage value of the cell is read. The process may then end at 525. Though the above processes have been described with respect to an entire example cross-point non-volatile memory, the process described with respect to FIGS. 3, 4, and 5 may be applied only to specific die, pages in the die, blocks of memory cells, or some other subset of memory cells.

In embodiments, the processes described above with respect to, for example FIGS. 3, 4, and 5 may provide significant benefits to a memory controller such as memory controller 110. Specifically, the net latency of the refresh process depicted in FIG. 4 may be on the order of approximately 200 nanoseconds, and the energy consumed may be on the order of approximately 80 picoJoules per memory cell. This latency and energy consumption may be approximately a third of the latency and energy of previously existing processes. The process depicted in FIG. 5 may have similar latency and/or energy savings.

Figure 6:
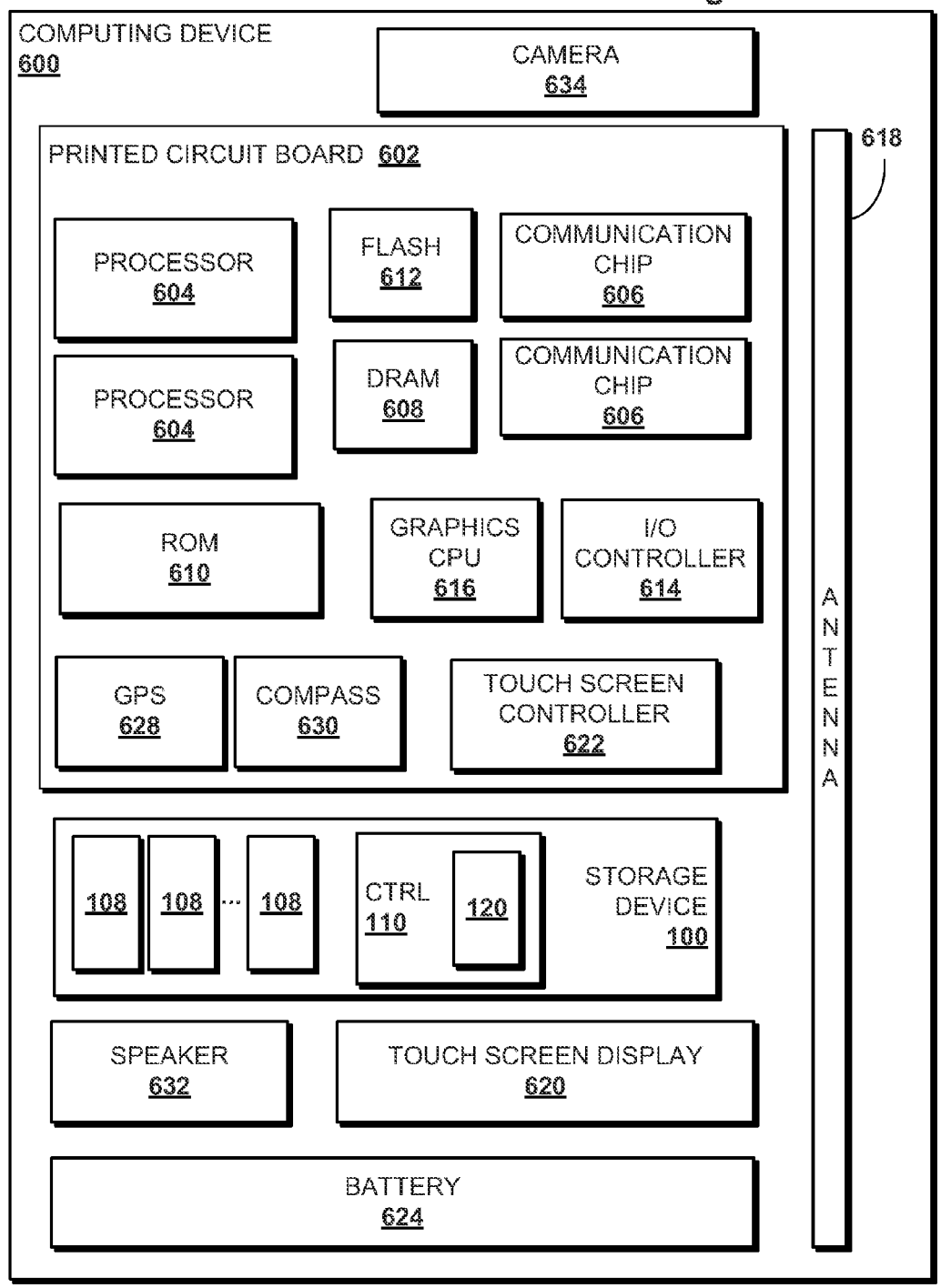
FIG. 6 illustrates an example system configured to perform the methods described herein, in accordance with various embodiments.

FIG. 6 illustrates an example computing device 600 in which systems such as earlier described cross-point non-volatile memory 104, memory controller 110 and/or read/write module 120 may be incorporated, in accordance with various embodiments. Computing device 600 may include a number of components, one or more processor(s) 604, cross-point non-volatile memory 104 in the form of one or more dies 108, memory controller 110, read/write module 120, and at least one communication chip 606.

In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computing device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computing device 600 may include other components that may or may not be physically and electrically coupled to the PCB 602. These other components include, but are not limited to, volatile memory (e.g., dynamic RAM (DRAM) 608), non-volatile memory such as ROM 610, an I/O controller 614, a digital signal processor (not shown), a crypto processor (not shown), a graphics processor 616, one or more antenna 618, a display (not shown), a touch screen display 620, a touch screen controller 622, a battery 624, an audio codec (not shown), a video codec (not shown), a global positioning system (GPS) device 628, a compass 630, an accelerometer (not shown), a gyroscope (not shown), a speaker 632, a camera 634, and a mass storage device (such as hard disk drive, a solid state drive, compact disk (CD), digital versatile disk (DVD)) (not shown), and so forth. In various embodiments, the processor 604 may be integrated on the same die with other components to form a System on Chip (SoC). In embodiments, one or both of the DRAM 608 and/or the ROM 610 may be or may include a cross-point non-volatile memory such as cross-point non-volatile memory 104, which may be respectively coupled with a memory controller such as memory controller 110.

In various embodiments, rather than or in addition to cross-point non-volatile memory 104, computing device 600 may include resident persistent or non-volatile memory, e.g., flash memory 612. In some embodiments, the one or more processor(s) 604 and/or flash memory 612 may include associated firmware (not shown) storing programming instructions configured to enable computing device 600, in response to execution of the programming instructions by one or more processor(s) 604 to practice all or selected aspects of the blocks described above with respect to FIG. 3, 4 or 5. In various embodiments, these aspects may additionally or alternatively be implemented using hardware separate from the one or more processor(s) 604 or flash memory 612.

The communication chips 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a computing tablet, a personal digital assistant (PDA), an ultra mobile PC, a mobile phone, a desktop computer, a server, a printer, a scanner, a monitor, a set-top box, an entertainment control unit (e.g., a gaming console), a digital camera, a portable music player, or a digital video recorder. In further implementations, the computing device 600 may be any other electronic device that processes data.

In embodiments, a first example of the present disclosure may include a memory controller to refresh a voltage value of a memory cell, the memory controller comprising: read logic configured to read a voltage value of a memory cell in a cross-point non-volatile memory having a plurality of memory cells, wherein the plurality of memory cells have voltage values respectively set to a first threshold voltage or a second threshold voltage; and write logic coupled with the read logic and configured to refresh the voltage value of a first one or more of the plurality of memory cells set to the second threshold voltage without altering the voltage value of a second one or more of the plurality of memory cells set to the first threshold voltage.

Example 2 may include the memory controller of example 1, wherein the second threshold voltage is higher than the first threshold voltage.

Example 3 may include the memory controller of example 1, wherein the cross-point non-volatile memory is a phase-change memory (PCM).

Example 4 may include the memory controller of any of examples 1-3, wherein the write logic is configured to perform a write operation to re-set the voltage value of each memory cell in the first one or more of the plurality of memory cells to the second threshold voltage to refresh the voltage value of the first one or more of the plurality of memory cells.

Example 5 may include the memory controller of any of examples 1-3, wherein the read logic is configured to refresh the voltage value of the second one or more of the plurality of memory cells by a comparison of the voltage value of each memory cell in the second one or more of the plurality of memory cells to a reference voltage.

Example 6 may include the memory controller of example 5, wherein the reference voltage is greater than the first threshold voltage value and less than the second threshold voltage value.

Example 7 may include the memory controller of any of examples 1-3, further comprising error correction logic coupled with the read logic and the write logic, the error correction logic configured to: identify a third one or more memory cells of the plurality of memory cells that produce an error upon a read of the voltage value of the third one or more memory cells by the read logic; and detect whether a count of the third one or more memory cells of the plurality of memory cells exceed an error threshold.

Example 8 may include the memory controller of example 7, wherein the write logic is further configured to: perform a write operation, in response to a detection by the error correction logic that the count of the third one or more memory cells of the plurality of memory cells exceeds the error threshold, to reset the respective voltage values of each memory cell in the third one or more memory cells to the first threshold voltage if the memory cell is set to the first threshold voltage; and perform a write operation, in response to the detection by the error correction logic, to reset the respective voltage values of each memory cell in the third one or more memory cells to the second threshold voltage if the memory cell is set to the second threshold voltage.

Example 9 may include a method of refreshing a voltage value of a memory cell, comprising: refreshing, by a memory controller, a first voltage value of a first memory cell in a cross-point non-volatile memory including a plurality of memory cells respectively having a voltage value set to a first threshold voltage or a second threshold voltage, the first voltage value of the first memory cell set to the first threshold voltage, and wherein the refreshing includes comparing the first voltage value of the first memory cell to a reference voltage; detecting, by the memory controller and after the refreshing, one or more memory cells in the plurality of memory cells that produce an error upon reading respective voltage values of the one or more memory cells; comparing, by the memory controller, a number of the one or more memory cells with an error threshold value; and refreshing, by the memory controller if the number of the one or more memory cells is less than the error threshold value, a second voltage value of a second memory cell in the cross-point non-volatile memory by re-writing the second threshold voltage to the second memory cell without altering the first voltage value of the first memory cell.

Example 10 may include the method of example 9, further comprising: refreshing, by the memory controller if the number of the one or more memory cells is greater than the error threshold value, the first voltage value of the first memory cell by re-writing the first threshold voltage to the first memory cell.

Example 11 may include the method of examples 9 or 10, wherein the first threshold voltage is less than the second threshold voltage.

Example 12 may include the method of examples 9 or 10, wherein the reference voltage is greater than the first threshold voltage value.

Example 13 may include the method of examples 9 or 10, wherein the cross-point non-volatile memory is a phase-change memory (PCM).

Example 14 may include one or more computer readable media comprising instructions to refresh a voltage value of a memory cell, the instructions configured to, upon execution of the instructions by a computing device, cause a memory controller of the computing device to: refresh a first voltage value of a first memory cell in a cross-point non-volatile memory including a plurality of memory cells set to a first threshold voltage or a second threshold voltage, wherein the refresh includes a comparison of the first voltage value of the first memory cell to a reference voltage; and refresh a second voltage value of a second memory cell in the cross-point non-volatile memory by re-writing the second threshold voltage to the second memory cell.

Example 15 may include the one or more computer readable media of example 14, wherein the instructions are further configured to cause the memory controller to: detect, subsequent to the refresh of the first voltage value and the refresh of the second voltage value, one or more memory cells in the plurality of memory cells that produce an error upon a read of a respective voltage value of the one or more memory cells; compare, by the memory controller, a number of the one or more memory cells with an error threshold value; and refresh, by the memory controller if the number of the one or more memory cells is greater than the error threshold value, the respective voltage value of the one or more memory cells.

Example 16 may include the one or more computer readable media of example 15, wherein the refresh of the respective voltage value of the one or more memory cells includes: re-write the first threshold voltage to a first subset of memory cells in the one or more memory cells that are set to the first threshold voltage; and re-write the second threshold voltage to a second subset of memory cells in the one or more memory cells that are set to the second threshold voltage.

Example 17 may include the one or more computer readable media of any of examples 14-16, wherein the first threshold voltage value is less than the second threshold voltage value.

Example 18 may include the one or more computer readable media of any of examples 14-16, wherein the reference voltage is greater than the first threshold voltage value.

Example 19 may include the one or more computer readable media of any of examples 14-16, wherein the cross-point non-volatile memory is a phase-change memory (PCM).

Example 20 may include an apparatus configured to refresh a voltage value of a memory cell, the apparatus comprising: means to refresh a first voltage value of a first memory cell in a cross-point non-volatile memory that includes a plurality of memory cells that respectively have a voltage value set to a first threshold voltage or a second threshold voltage, the first voltage value of the first memory cell set to the first threshold voltage, and wherein the means to refresh include means to compare the first voltage value of the first memory cell to a reference voltage; means to detect, subsequent to a refresh by the means to refresh, one or more memory cells in the plurality of memory cells that produce an error upon reading respective voltage values of the one or more memory cells; means to compare a number of the one or more memory cells with an error threshold value; and means to refresh, if the number of the one or more memory cells is less than the error threshold value, a second voltage value of a second memory cell in the cross-point non-volatile memory by a re-write the second threshold voltage to the second memory cell without an alteration of the first voltage value of the first memory cell.

Example 21 may include the apparatus of example 20, further comprising: means to refresh, if the number of the one or more memory cells is greater than the error threshold value, the first voltage value of the first memory cell by a re-write of the first threshold voltage to the first memory cell.

Example 22 may include the apparatus of examples 20 or 21, wherein the first threshold voltage is less than the second threshold voltage.

Example 23 may include the apparatus of examples 20 or 21, wherein the reference voltage is greater than the first threshold voltage value.

Example 24 may include the apparatus of examples 20 or 21, wherein the cross-point non-volatile memory is a phase-change memory (PCM).

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. A memory controller comprising:
   read logic to read a voltage value of a memory cell in a cross-point non-volatile memory having a plurality of memory cells, wherein the plurality of memory cells have voltage values respectively set to a first threshold voltage or a second threshold voltage; and
   write logic coupled with the read logic and to refresh the voltage value of a first one or more of the plurality of memory cells set to the second threshold voltage without altering the voltage value of a second one or more of the plurality of memory cells set to the first threshold voltage;
   wherein the write logic is to
      perform a write operation, in response to a detection that an error count of a third one or more memory cells of the plurality of memory cells exceeds an error threshold, to reset the respective voltage values of each memory cell in the third one or more memory cells to the first threshold voltage if the memory cell is set to the first threshold voltage; and
      perform a write operation, in response to the detection, to reset the respective voltage values of each memory cell in the third one or more memory cells to the second threshold voltage if the memory cell is set to the second threshold voltage.

2. The memory controller of claim 1, wherein the second threshold voltage is higher than the first threshold voltage.

3. The memory controller of claim 1, wherein the cross-point non-volatile memory is a phase-change memory (PCM).

4. The memory controller of claim 1, wherein the write logic is to perform a write operation to re-set the voltage value of each memory cell in the first one or more of the plurality of memory cells to the second threshold voltage to refresh the voltage value of the first one or more of the plurality of memory cells.

5. The memory controller of claim 1, wherein the read logic is to refresh the voltage value of the second one or more of the plurality of memory cells by a comparison of the voltage value of each memory cell in the second one or more of the plurality of memory cells to a reference voltage.

6. The memory controller of claim 5, wherein the reference voltage is greater than the first threshold voltage value and less than the second threshold voltage value.

7. The memory controller of claim 1, further comprising error correction logic coupled with the read logic and the write logic, the error correction logic to:
   identify the third one or more memory cells of the plurality of memory cells as having produced an error upon a read of the voltage value of the third one or more memory cells by the read logic; and
   detect whether the count of the third one or more memory cells of the plurality of memory cells exceed the error threshold.

8. A method comprising:
   refreshing, by a memory controller, a first voltage value of a first memory cell in a cross-point non-volatile memory including a plurality of memory cells respectively having a voltage value set to a first threshold voltage or a second threshold voltage, the first voltage value of the first memory cell set to the first threshold voltage, and wherein the refreshing includes comparing the first voltage value of the first memory cell to a reference voltage;
   detecting, by the memory controller and after the refreshing, one or more memory cells in the plurality of memory cells that produce an error upon reading respective voltage values of the one or more memory cells;
   comparing, by the memory controller, a number of the one or more memory cells with an error threshold value; and
   refreshing, by the memory controller if the number of the one or more memory cells is less than the error threshold value, a second voltage value of a second memory cell in the cross-point non-volatile memory by re-writing the second threshold voltage to the second memory cell without altering the first voltage value of the first memory cell.

9. The method of claim 8, further comprising:
   refreshing, by the memory controller if the number of the one or more memory cells is greater than the error threshold value, the first voltage value of the first memory cell by re-writing the first threshold voltage to the first memory cell.

10. The method of claim 8, wherein the first threshold voltage is less than the second threshold voltage.

11. The method of claim 8, wherein the reference voltage is greater than the first threshold voltage value.

12. The method of claim 8, wherein the cross-point non-volatile memory is a phase-change memory (PCM).

13. One or more non-transitory computer readable media comprising instructions to, upon execution of the instructions by a memory controller of the computing device, cause the memory controller to:

refresh a first voltage value of a first memory cell in a cross-point non-volatile memory including a plurality of memory cells set to a first threshold voltage or a second threshold voltage, wherein the refresh includes a comparison of the first voltage value of the first memory cell to a reference voltage;

refresh a second voltage value of a second memory cell in the cross-point non-volatile memory by re-writing the second threshold voltage to the second memory cell; and refresh, if a number of detected errors of the one or more memory cells is greater than an error threshold value, the respective voltage value of the one or more memory cells, wherein the refresh of the respective voltage value of the one or more memory cells includes:

re-write the first threshold voltage to a first subset of memory cells in the one or more memory cells that are set to the first threshold voltage; and re-write the second threshold voltage to a second subset of memory cells in the one or more memory cells that are set to the second threshold voltage.

14. The one or more non-transitory computer readable media of claim 13, wherein the instructions are further to cause the memory controller to:

detect, subsequent to the refresh of the first voltage value and the refresh of the second voltage value, whether one or more memory cells in the plurality of memory cells produce an error upon a read of a respective voltage value of the one or more memory cells; and compare a number of the one or more memory cells with an error threshold value.

15. The one or more non-transitory computer readable media of claim 13, wherein the first threshold voltage value is less than the second threshold voltage value.

16. The one or more non-transitory computer readable media of claim 13, wherein the reference voltage is greater than the first threshold voltage value.

17. The one or more non-transitory computer readable media of claim 13, wherein the cross-point non-volatile memory is a phase-change memory (PCM).

* * * * *